(12) United States Patent
Shimmura

(10) Patent No.: US 7,407,848 B2
(45) Date of Patent: Aug. 5, 2008

(54) METHODS OF MANUFACTURING SEMICONDUCTOR THIN FILM, ELECTRONIC DEVICE AND LIQUID CRYSTAL DISPLAY DEVICE

(75) Inventor: Tadashi Shimmura, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 28 days.

(21) Appl. No.: 11/498,773

(22) Filed: Aug. 4, 2006

(65) Prior Publication Data

US 2007/0059890 A1  Mar. 15, 2007

(30) Foreign Application Priority Data

Sep. 9, 2005  (JP)  ............... 2005-261559

(51) Int. Cl.
*H01L 21/324*  (2006.01)
(52) U.S. Cl. .................. 438/166; 438/487; 438/795; 257/E21.134
(58) Field of Classification Search .......... 438/166, 438/487, 795; 257/E21.134
See application file for complete search history.

(56) References Cited

U.S. PATENT DOCUMENTS

| | | | | |
|---|---|---|---|---|
| 5,585,291 A | * | 12/1996 | Ohtani et al. | 438/486 |
| 5,696,003 A | * | 12/1997 | Makita et al. | 438/166 |
| 5,843,225 A | * | 12/1998 | Takayama et al. | 117/8 |
| 5,851,860 A | * | 12/1998 | Makita et al. | 438/166 |
| 5,854,096 A | * | 12/1998 | Ohtani et al. | 438/166 |
| 5,858,823 A | * | 1/1999 | Yamazaki et al. | 438/166 |
| 5,886,366 A | * | 3/1999 | Yamazaki et al. | 257/59 |
| 5,932,893 A | * | 8/1999 | Miyanaga et al. | 257/66 |
| 5,936,291 A | * | 8/1999 | Makita et al. | 257/405 |
| 6,074,901 A | * | 6/2000 | Ohtani et al. | 438/166 |
| 6,162,667 A | * | 12/2000 | Funai et al. | 438/166 |
| 6,613,613 B2 | * | 9/2003 | Yamazaki et al. | 438/149 |
| 6,627,487 B2 | * | 9/2003 | Zhang | 438/166 |
| 6,734,050 B2 | * | 5/2004 | Nakazawa et al. | 438/151 |
| 6,974,732 B2 | * | 12/2005 | Ohtani et al. | 438/166 |
| 7,109,073 B2 | * | 9/2006 | Yamazaki | 438/150 |
| 7,195,992 B2 | * | 3/2007 | Gu et al. | 438/487 |
| 2001/0005606 A1 | * | 6/2001 | Tanaka et al. | 438/151 |
| 2002/0055208 A1 | * | 5/2002 | Ohtani et al. | 438/151 |
| 2002/0086471 A1 | * | 7/2002 | Maekawa et al. | 438/166 |
| 2002/0164842 A1 | * | 11/2002 | Nakajima | 438/149 |
| 2003/0067004 A1 | * | 4/2003 | Nakazawa et al. | 257/66 |
| 2004/0191410 A1 | * | 9/2004 | Morii et al. | 427/115 |
| 2004/0211329 A1 | * | 10/2004 | Funahata et al. | 101/463.1 |
| 2007/0105352 A1 | * | 5/2007 | Gu et al. | 438/487 |

* cited by examiner

*Primary Examiner*—George Fourson
(74) *Attorney, Agent, or Firm*—Oblon, Spivak, McClelland, Maier & Neustadt, P.C.

(57) ABSTRACT

A semiconductor thin film manufacturing method includes: forming a semiconductor thin film on a substrate; forming a transcriptional body containing a metal element on a part thereof; bringing a part of the transcriptional body into contact with the semiconductor thin film, and transferring the metal element onto the semiconductor thin film; and fusing the semiconductor thin film and crystallizing the semiconductor thin film using the metal element of the solution as crystal producing nucleuses.

20 Claims, 5 Drawing Sheets

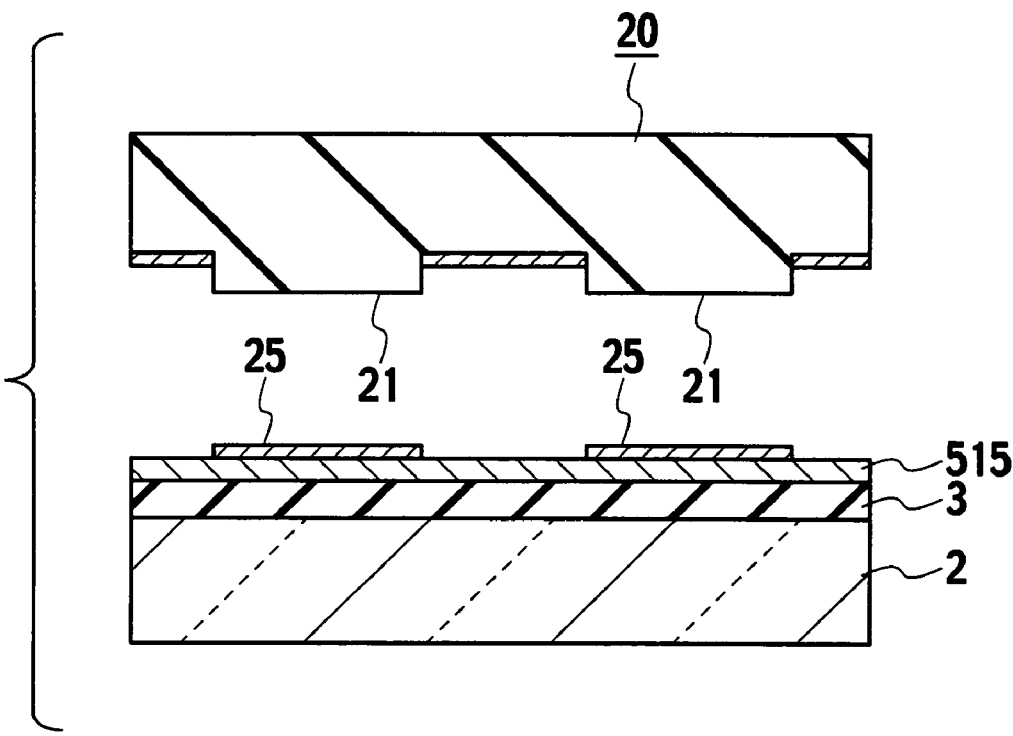
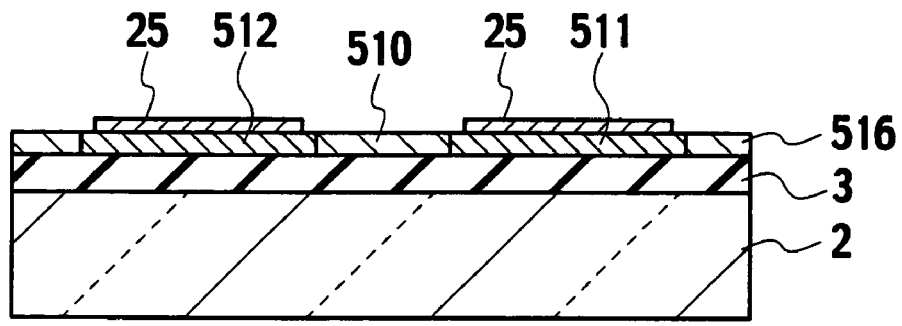

METHODS OF MANUFACTURING SEMICONDUCTOR THIN FILM, ELECTRONIC DEVICE AND LIQUID CRYSTAL DISPLAY DEVICE

CROSS REFERENCE TO RELATED APPLICATIONS

This application is based upon and claims the benefit of the priority from prior Japanese Patent Application No. 2005-261559 filed on Sep. 9, 2005, the entire contents of which are incorporated by reference herein

BACKGROUND OF THE INVENTION

1. Field of the Invention

The present invention relates to a method of manufacturing a semiconductor thin film, and methods of manufacturing an electronic device and a liquid crystal display device, and more particularly relates to a method of manufacturing a crystalline semiconductor thin film, and methods of manufacturing an electronic device and a liquid crystal display device constituted by the semiconductor thin films manufactured by the foregoing method.

2. Description of the Related Art

Japanese Patent publication No. 2004-119,518 (called "Reference 1") discloses a method of manufacturing a crystalline semiconductor thin film assuring high carrier mobility. In the method, an amorphous semiconductor thin film is deposited on an insulating substrate. Energy beams are illuminated onto the amorphous semiconductor thin film in order to change amorphous properties to crystal properties, so that a crystalline semiconductor thin film will be formed. Specifically, the amorphous semiconductor thin film is fused by energy beams, is solidified, and is changed into the crystalline semiconductor thin film.

The foregoing method is applied to manufacturing a thin film transistor (TFT) of a liquid crystal display device (liquid crystal display panel). Specifically, an amorphous Si (silicon) thin film is formed on a transparent quartz substrate via an insulating layer. Laser beams are illuminated onto the amorphous silicon (Si) thin film, which is changed to a polycrystalline Si thin film. The polycrystalline Si thin film is used as a source region, a channel forming region or a drain region of a thin film transistor.

When energy beams are illuminated onto the amorphous Si film placed on the flat transparent quartz substrate, heat generated by the energy beams is uniformly conducted into the quartz substrate. Therefore, it is impossible to control, in the quartz substrate, positions of crystal producing nucleuses, and a speed at which the amorphous Si thin film is solidified. In short, it is impossible to control positions and diameters of Si crystal grains in the crystallized Si thin film.

In the liquid crystal display device, positions of and quantities Si crystal gains are different in source regions, channel forming regions and drain regions of each thin film transistor. This will lead to variations in electric properties such as carrier mobility, threshold voltages, and leak currents. Further, positions, quantity and diameters of Si crystal gains are different in respective source regions, channel forming regions and drain regions of each thin film transistor in each production lot. This also may lead to variations in the electric properties such as carrier mobility values, threshold voltages, and leak currents. The variations of electric properties will adversely affect performance of the liquid crystal display device.

When energy beams are illuminated onto the amorphous Si thin film, a crystalline Si thin film should be made in order to suppress the generation of irregular crystal nucleuses, to promote the generation and growth of crystal nucleuses at predetermined positions, and to have large crystal grains. Japanese Patent No. 3,464,287 (called "Reference 2") describes the method, in which a metal element promoting crystallization is selectively introduced into an amorphous thin film in order to enable a crystalline thin film to be produced at a low temperature. Specifically, a masking material such as an aluminum nitride film is deposited on the amorphous thin film, and a partially porous mask is prepared by the photolithography or the like. Thereafter, a solution containing a metal element is selectively applied onto the amorphous thin film via the pores on the mask. The metal element partially crystallizes the amorphous thin film.

However, the following matters seem to remain unsolved in the crystalline thin film manufacturing method of Reference 2. Specifically, the mask for selectively applying the solution including the metal element has to be made through a plurality of manufacturing processes such as deposition of the masking material, application of a photo-resist film, making, exposure and development of a photo mask, and patterning (etching) of the masking material using the photo mask. This will lead to increases of the manufacturing processes and manufacturing cost, and lowering of a productivity rate and yield.

BRIEF SUMMARY OF THE INVENTION

According to a first aspect of the invention, there is provided a method of manufacturing a semiconductor thin film. The method includes: forming a semiconductor thin film on a substrate; forming a transcriptional body containing a metal element on a part thereof, bringing a part of the transcriptional body into contact with the semiconductor thin film, and transferring the metal element onto the semiconductor thin film; and fusing the semiconductor thin film and crystallizing the semiconductor thin film using the metal element of the solution as crystal producing nucleuses.

According to a second aspect of the invention, there is provided a method of manufacturing a semiconductor thin film. The method includes: forming a semiconductor thin film on a substrate; selectively applying a solution onto a part of a transcriptional body, the solution containing a metal element serving as crystal producing nucleuses; bringing a part of the transcriptional body into contact with the semiconductor thin film, and transferring the solution onto the semiconductor thin film; and fusing the semiconductor thin film and crystallizing the semiconductor thin film using the metal element of the solution as crystal producing nucleuses.

In a third aspect of the invention, there is provided a method of manufacturing an electronic device. The method includes: forming a semiconductor thin film on a substrate; selectively applying a solution onto a segmented surface of a transcriptional body, the solution containing a metal element serving as crystal producing nucleuses; bringing a part of the transcriptional body into contact with the semiconductor thin film and transferring the solution from the transcriptional body to the semiconductor thin film; and fusing the semiconductor thin film, crystallizing the semiconductor thin film using the metal element of the solution as crystal producing nucleuses, and making a semiconductor element.

According to a final aspect of the invention, there is provided a method of manufacturing a liquid crystal display device. The method includes: forming a semiconductor thin film on a first transparent substrate; forming a transcriptional body on a part of the semiconductor thin film where a main electrode of a transistor or an isolation region between transistor is made, the transcriptional body containing a metal element serving as crystal producing nucleuses; bringing a part of the transcriptional body into contact with the semiconductor thin film and transferring the metal element of the transcriptional body onto the semiconductor thin film; fusing the semiconductor thin film and crystallizing the semiconductor thin film using the metal element as crystal producing nucleuses; forming a transistor on the crystallized semiconductor thin film; and placing a second transparent substrate on the first transparent substrate, and enclosing a liquid crystal between the first and second transparent substrates.

BRIEF DESCRIPTION OF SEVERAL VIEWS OF THE DRAWINGS

FIG. 6 is a cross section of the liquid crystal display device in a fourth manufacturing process;

FIG. 7 is a cross section of the liquid crystal display device in a fifth manufacturing process;

DETAILED DESCRIPTION OF THE INVENTION

Figure 1:
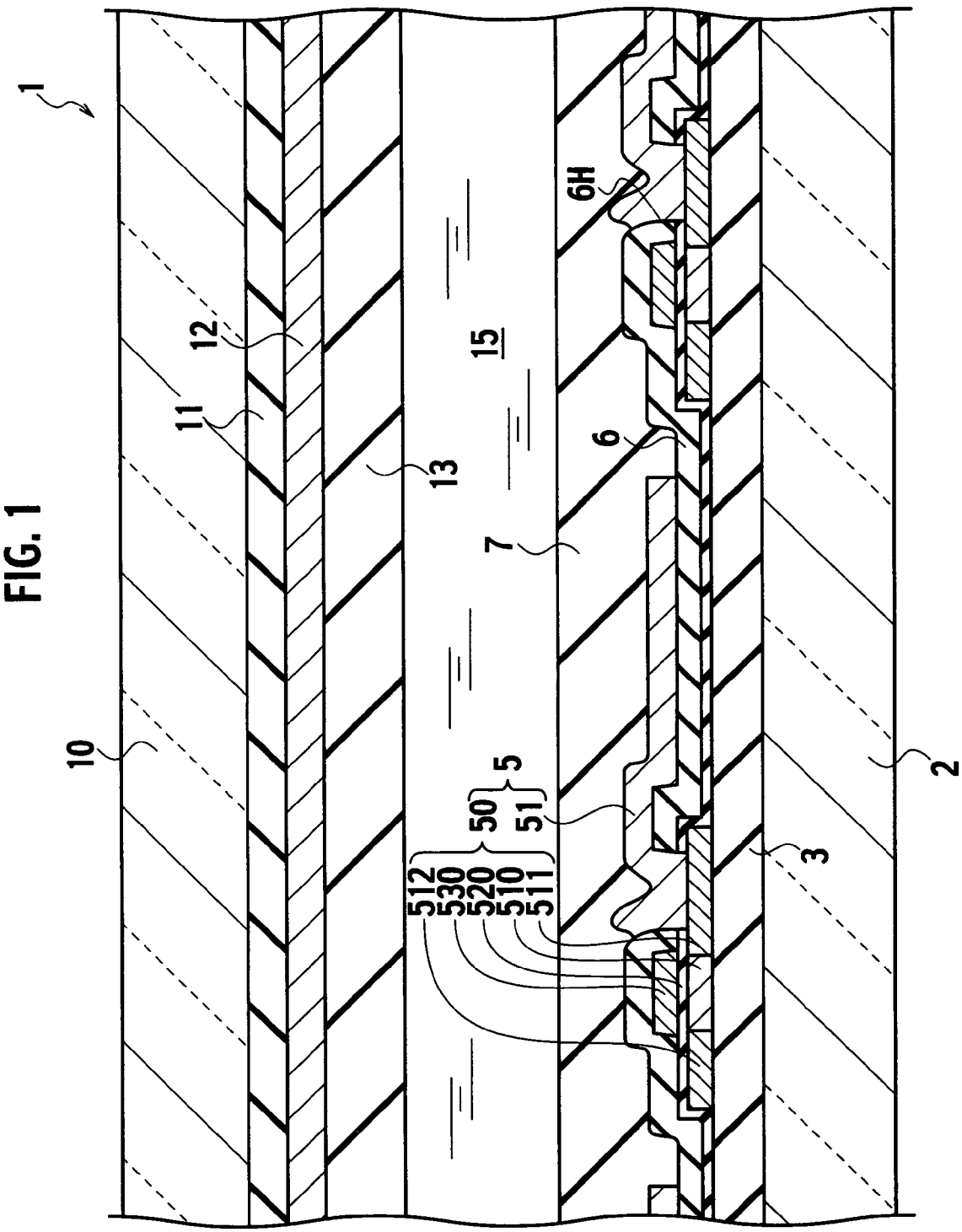
FIG. 1 is a cross section of an essential part of a liquid crystal display device (semiconductor thin film) to a first embodiment of the invention.

In the embodiment of the invention is assumed to be applied to a liquid crystal display device shown in the drawings.

First Embodiment

Structure of Liquid Crystal Display Device

Referring to FIG. 1, a liquid display device 1 includes a first transparent substrate 2, a foundation 3, and thin film transistors (TFT) 50. The foundation 3 is placed on a surface (an upper side in FIG. 1) of the first transparent substrate 2. Further, the liquid crystal display device 1 includes pixel electrodes 51, a liquid crystal 15, a common pixel electrode 12, and a second transparent substrate 10.

The first and second transparent substrates 2 and 10 are transparent quartz substrates, for instance. The liquid crystal 15 is enclosed between the first and second transparent substrates 2 and 10.

The thin film transistors 50 are placed on the first transparent substrate 2 via the foundation 3, and are arranged in the matrix shape. In this example, one pixel electrode 51 is provided for each thin film transistor 50, for instance. Each thin film transistor 50 (i.e., a first main electrode region 511) and each pixel electrode 51 are electrically connected in series, and constitute one pixel 5.

Each thin film transistor 50 includes a channel forming region 510, a first main electrode region 511, a second main electrode region 512, a gate insulator 520 on the channel forming region 510, and a control electrode (gate electrode) 530 on the gate insulator 520. The first main electrode region 511 is positioned on one end (at the right side in FIG. 1) of the channel forming region 510, and serves as a source region. The second main electrode region 512 is present at the other end (at the left side in FIG. 1) of the channel forming region 510, and serves as a drain region.

The channel forming region 510 and the first and second main electrode regions 511 and 512 are made of crystalline semiconductor films which are flush with one another, more specifically polycrystalline Si thin films (516). The polycrystalline Si thin films are prepared by making amorphous Si thin films in the manufacturing process of the liquid crystal display device 1 (the semiconductor thin film or electronic device manufacturing method), and crystallizing the amorphous Si thin films. As will be described later, a solution (25) containing a metal element is selectively applied onto a part of the amorphous Si thin film. The metal element in the solution (25) is used as cores for radially crystallizing the amorphous Si thin films.

The foundation 3 is used for making the thin film transistor 50 (especially a channel forming region 510), and first and second main electrode regions 511 and 512. Preferably, the foundation 3 has a flat surface, and is made of an oxide silicon (Si) film, a nitride Si film, or a combined film of the oxide Si film and nitride Si film.

The gate insulator 520 of the thin film transistor 50 is placed on the channel forming region 510 which is made of an oxide Si film, a nitride Si film, an oxide-nitride film, or combined films of the foregoing materials, for instance. The control electrode 530 is placed on the channel forming region 510 via the gate insulator 520, and is made of a polycrystalline Si film, a refractory metal film such as tungsten (W) and molybdenum (Mo), a silicide film which is a compound of polycrystalline Si and refractory metal, or a combined film of a refractory metal placed on the polycrystalline Si film or silicide film.

The pixel electrode 51 is placed on an interlayer dielectric 6 extending over the thin film transistor 50, and is electrically connected to the first main electrode region 511 of the thin film transistor 50 via a connection hole 6H. The pixel electrode 51 is preferably made of an ITO film, for instance.

Figure 2:
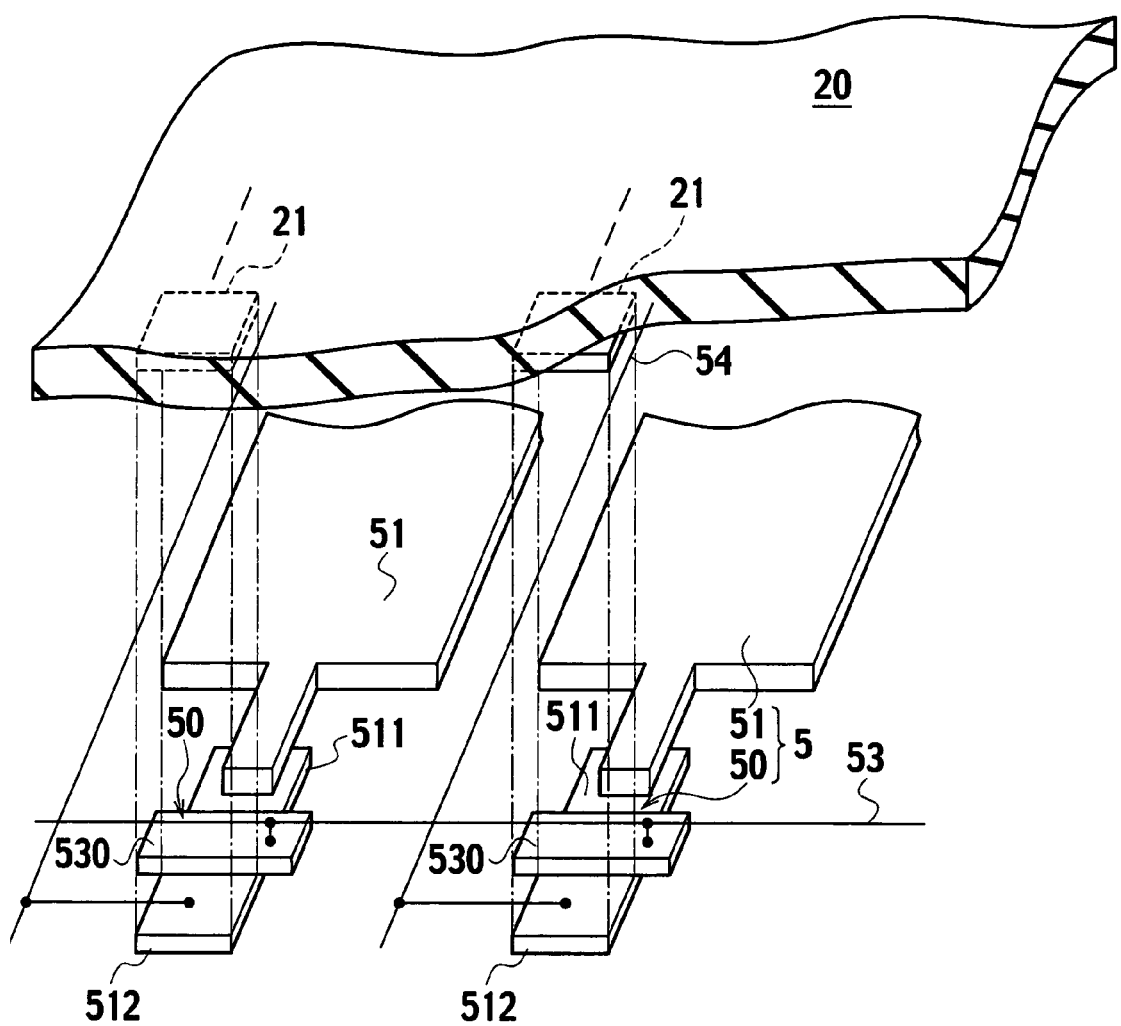
FIG. 2 is an exploded perspective view of the liquid crystal display device of FIG. 1, the liquid crystal display device being in a transfer process of a liquid crystal display device manufacturing method.

As schematically shown in FIG. 2, the control electrodes 530 of the thin film transistors 50 are arranged in the matrix shape, and are electrically connected to vertical scanning lines (gate signal lines) 53. Each vertical scanning line 53 is flush with and integral with each control electrode 530. Further, the second main electrode regions 512 of the thin film transistors 50 are electrically connected to horizontal scanning lines (image signal lines) 54. The horizontal scanning lines 54 are positioned above the control electrodes 530, and are preferably made of a single high refractory metal film, a single-layer silicide film, a single-layer aluminum film or a combined layer made of the refractory metal or silicide film stacked on a polycrystalline Si film.

Referring to FIG. 1, a protection film 7 is provided on the pixels 5, specifically, on the pixel electrodes 51. The liquid crystal 11 is placed on the protection film 7.

A further foundation 11 is provided on an under side of the second transparent electrode 10 as shown in FIG. 1. The common pixel electrode 12 is placed on the foundation 11, and is made of the ITO film similarly to the pixel electrode 51 described above. The common pixel electrode 12 is covered by a protector film 13, which encloses the liquid crystal 15 together with the protector film 7.

[Method of Manufacturing Liquid Crystal Display Device (Semiconductor Thin Film)]

The following describes method of manufacturing the liquid crystal display device 1 (as an electronic device) of the first embodiment of the invention, and more particularly describes a method of fabricating a semiconductor thin film which is used to make the channel forming region 510, and the first and second main electrode regions 511 and 512 of the thin film transistor 50.

Figure 3:
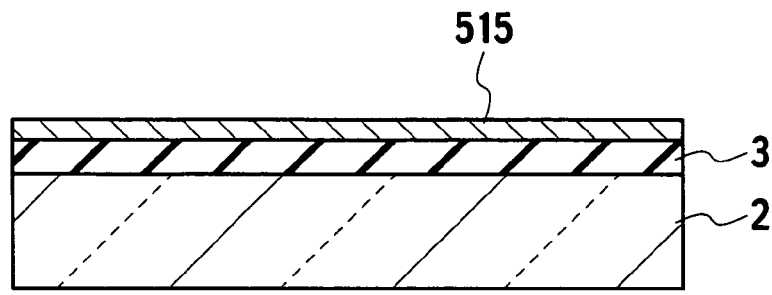
FIG. 3 is a cross section of the liquid crystal display device in a first manufacturing process.

The first transparent substrate 2 is prepared first of all. Referring to FIG. 3, the foundation 3 is applied all over the first transparent substrate 2. Thereafter, the amorphous semiconductor thin film 515 is formed all over the foundation 3. The foundation 3 is made of a single-layer oxide Si film, a single-layer nitride Si film, or a combined layer of the oxide Si film and the nitride Si film. The amorphous semiconductor thin film 515 is preferably an amorphous Si film prepared by the CVD process, for instance.

Figure 4:
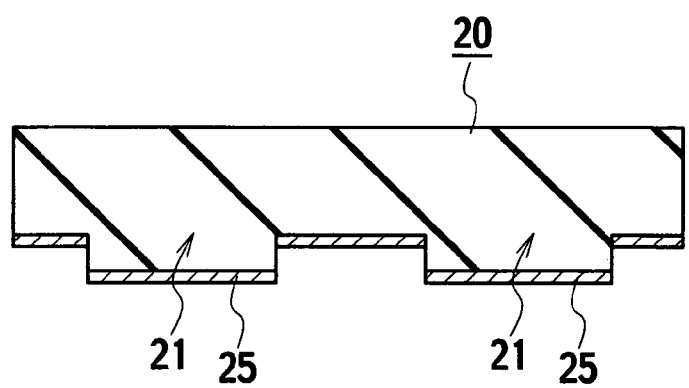
FIG. 4 is a cross section of the liquid crystal display device in a second manufacturing process.

A transcriptional body 20 is prepared as shown in FIG. 4. The solution 25 containing the metal element is applied onto the transcriptional body 20. The transcriptional body 20 includes raised transfer parts 21 and non-raised parts, and faces with the surface of the amorphous semiconductor thin film 515. The non-raised parts of the transcriptional body 20 project toward the amorphous semiconductor thin film 515. The solution 25 is applied onto the raised transfer parts 21 of the transcriptional body 20 by immersing the surfaces of the raised transfer parts 21 in a solution bath. Further, a layer of solution 25 may be formed on the raised transfer parts 21.

The solution 25 may extend over the non-raised parts of the transcriptional body 20 depending upon an application method thereof. However, the solution 25 selectively applied onto the raised transfer parts 21 sticks to the amorphous semiconductor thin film 515. The raised transfer parts 21 is designed to have a height which prevents the solution 25 on the non-raised parts from being transferred to the amorphous semiconductor thin film 515.

In the first example, the transcriptional body 20 is softer than the amorphous semiconductor film 515, and is preferably made of a silicone resin, which can be easily manufactured and processed, and allows easy adhering and removal of the solution 25. The transcriptional body 20 can easily deform in response to changing shapes of the amorphous semiconductor thin film 515, and can completely transfer the solution 25 to the amorphous semiconductor film 515.

Referring to FIG. 2, the raised transfer parts 21 of the transcriptional body 20 on the amorphous semiconductor thin film 515 are positioned directly above the first main electrode regions (source regions, for instance) 511 and the second main electrode regions (drain regions, for instance) 512. In short, the raised transfer parts 21 are arranged in the shape of a matrix.

The solution 25 preferably contains a metal element such as Ni, Co or Fe. The metal element serves as crystal producing nucleuses. In the first example, the solution 25 may be a Nickel sulfamete solution or a nickel acetate solution. Further, a cobalt dinitrate solution or a dilute acid iron solution containing Co or Fe may be usable.

Figure 5:
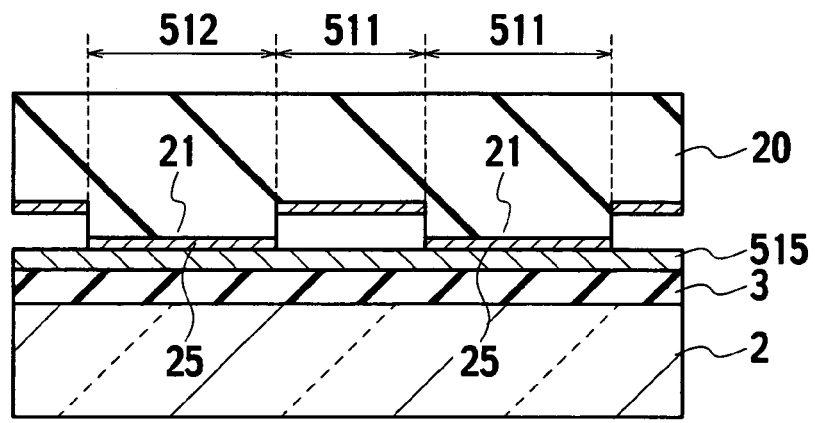
FIG. 5 is a cross section the a liquid crystal display device in a third manufacturing process.

The transcriptional body 20 coated with the solution 25 in the process shown in FIG. 3 is placed to face with the amorphous semiconductor thin film 515 (prepared in the process shown in FIG. 3). Referring to FIG. 5, the raised transfer parts 21 of the transcriptional body 20 are brought into contact with the amorphous semiconductor thin film 515, to which the solution 25 is transferred. As described above, the solution 25 is transferred onto the amorphous thin film 515 only at positions where the first and second main electrode regions 511 and 512 of the thin film transistor 50 are to be formed.

As shown in FIG. 6, the transcriptional body 20 is detached from the amorphous semiconductor thin film 515, so that the solution 25 applied onto the raised transfer parts 21 of the transcriptional body 20 remains on the amorphous semiconductor thin film 515. In other words, the solution 25 remains in the recesses of the transcriptional body 20, and is not transferred onto the amorphous thin film 515. This means that the solution 20 is selectively transferred onto the amorphous thin film 51 at the positions corresponding to the first and second main electrode regions 511 and 512.

Energy beams are illuminated in order to fuse the amorphous semiconductor thin film 515. In this case, excimer lasers are used. The metal element contained in the solution 25 produces a chemical compound (Si—Ni) together with Si of the amorphous semiconductor thin film 515. The chemical compound serves as grain producing nucleuses, and is used to re-crystallize the amorphous semiconductor thin film 515, which will be changed to a crystallized semiconductor thin film (polycrystalline Si thin film) 516 as shown in FIG. 7. Specifically, the amorphous semiconductor thin film 515 is re-crystallized around the positions corresponding to the first and second main electrode regions 511 and 512 of the thin film transistor 50. This enables positions of crystal grains to be reliably controlled in the crystallized semiconductor thin film 516, and the crystal grains to have a uniform diameter. Alternatively, re-crystallization may be performed by a lamp-annealing process which does not thermally damage the first transparent substrate 2.

In the first example, the amorphous semiconductor thin film 515 is re-crystallized using the regions for forming the first and second main electrodes 511 and 512 as the crystal producing nucleuses. There is a possibility that grains boundaries may be present in the channel forming regions 510. However, since the positions of crystal producing nucleuses (i.e., positions of and diameters of crystal grains) are controlled, the electric properties such as a threshold voltage and a leak current are uniform in a plurality of thin film transistors 50. Further, the solution 25 containing the metal element induces short-circuiting between the first and second main electrode regions 511 and 512, which prevents the solution 25 from being transferred to the channel forming region 510. Still further, no solution 25 is transferred to the channel forming region 510 of the amorphous semiconductor thin film 515. Therefore, the metal element in the solution 25 does not serve as a pollutant source which adversely affects the threshold voltage of the thin film transistor 50.

The gate insulator 510, the control electrode 520, and the first and second main electrode regions 511 and 512 are sequentially made on the crystallized semiconductor thin film 516. The channel forming region 510 is made using the crystallized semiconductor thin film 516 between the first and second main electrode regions 511 and 512. Thus, the thin film transistor 50 is completed (refer to FIG. 1).

The interlayer dielectric 6 is made and extends over the thin film transistor 50. The connection hole 6H is made in the interlayer dielectric 6 above the first main electrode region 511. The pixel electrode 51 to be connected to the first main electrode region 511 via the connection hole 6H is made on the interlayer dielectric 6 (refer to FIG. 1). The pixel electrode 51 and the thin film transistor 50 constitute a series circuit for the pixel 5. Then, the pixel 5 is covered by the protector 7.

Further, the second transparent substrate 10 is prepared. The foundation 11, common pixel electrode 12 and protector 13 are formed on the second transparent substrate 10 one after the other.

The first and second transparent substrates 2 and 10 are placed to face with each other. The liquid crystal 15 is enclosed between the first and second transparent substrates 2 and 10. Thus, the liquid crystal display device 1 is completed.

In the manufacturing method of the first example, the solution 25 contains the metal element, is applied onto the raised transfer parts 21 of the transcriptional body 20, and is selectively transferred onto the amorphous semiconductor thin film 515. The amorphous semiconductor thin film 515 is re-crystallized using the parts thereof coated with the solution 25 as the crystal producing nucleuses. Therefore, it is possible to reliably control the positions and diameter of crystal grains, and to reduce the number of manufacturing processes. This is because no mask making process is necessary for making the crystal producing nucleuses.

Further, the amorphous semiconductor thin film 515 is re-crystallized at its positions at which the first and second main electrode regions 511 and 512 of the thin film transistor 50 are to be formed, and which are used as crystal producing nucleuses. Therefore, even if there are grain boundaries in the channel forming region 510, a plurality of thin film transistors 50 have the uniform number of grain boundaries. Further, the thin film transistors 50 are relatively free from variations of current-voltage properties. The foregoing enables the liquid crystal display device 1 to assure reliable display performance.

Alternatively, the solution 25 may be transferred into isolation regions of thin film transistors 50 which are adjacent on the amorphous semiconductor thin film 515.

Second Embodiment

A second embodiment of the invention differs from the first embodiment in a structure of the transcriptional body 20 and a method of making grain producing nucleuses.

First of all, the foundation 3 is prepared on the first transparent substrate as shown in FIG. 3. The amorphous semiconductor thin film 515 is formed on the foundation 3.

Figure 8:
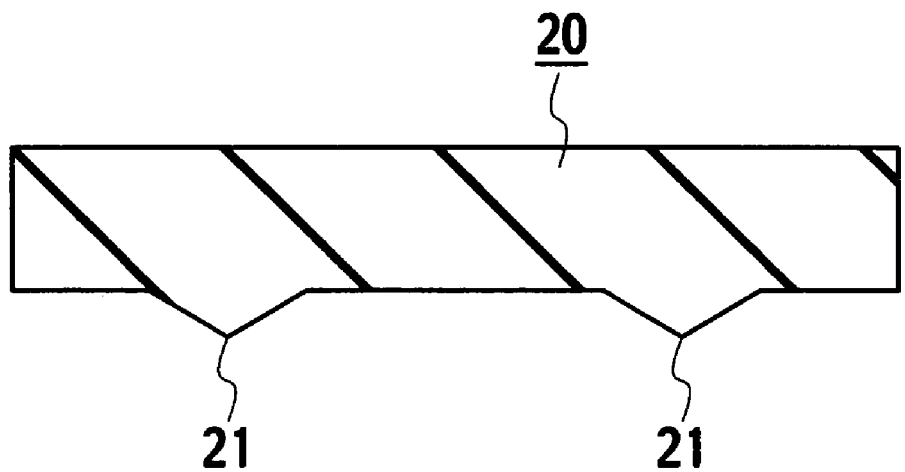
FIG. 8 is a cross section of an essential part of a transcriptional body used in a transfer process of a method of manufacturing a liquid crystal display device in a second embodiment of the invention.

The transcriptional body 20 is formed as shown in FIG. 8 in order to make crystal producing nucleuses which are used to re-crystallize the amorphous semiconductor thin film 515. The transcriptional body 20 is made of a material for making crystal producing nucleuses, and includes raised transfer parts 21 which are conical or pyramidal. The raised transfer parts 21 may have a different shape. Further, the most or all of the transcriptional body 20 and the raised transfer parts 21 may be made of the same material.

In the second embodiment, the transcriptional body 20 and the raised transfer parts 21 are made of nickel (Ni), and are brought into pressure contact with the amorphous semiconductor thin film 515. In this state, a chemical compound Si—Ni is produced on the amorphous semiconductor thin film 515 because of the chemical reaction between Ni of the raised transfer parts 21 and Si of the amorphous semiconductor thin film 515. The chemical compound Si—Ni is used as grain producing nucleuses. Alternatively, the raised transfer parts 21 may be made of Fe, Co or the like.

Figure 9:
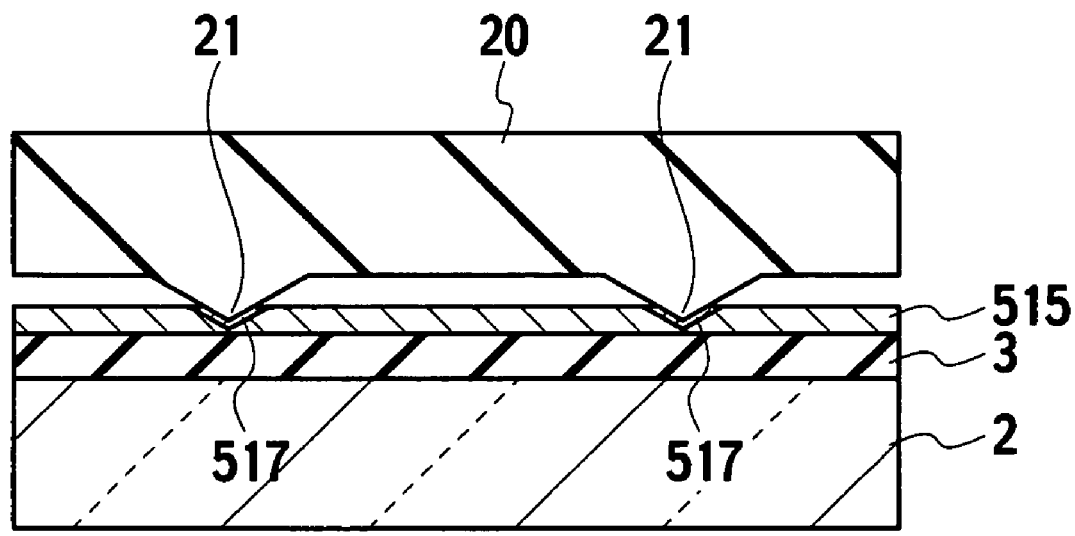
FIG. 9 is a cross section of the liquid crystal display device in the method of the second embodiment.

The transcriptional body 20 is placed on the amorphous semiconductor thin film 515. As shown in FIG. 9, the raised transfer parts 21 of the transcriptional body 20 are pressed to the amorphous semiconductor thin film 515. In this state, the chemical compound Si—Ni is produced on the amorphous semiconductor thin film 515 because of the chemical reaction between Ni of the raised transfer parts 21 and Si of the amorphous semiconductor thin film 515. The chemical compound Si—Ni is used as grain producing nucleuses 517. On the amorphous semiconductor thin film 515, the crystal producing nucleuses 517 are made only at the regions (or isolation regions) where the first and second main electrode regions 511 and 512 are formed.

The transcriptional body 20 is detached from the amorphous semiconductor thin film 515. Thereafter, the amorphous semiconductor thin film 515 is radially re-crystallized around the grain producing nucleuses 517 as in the method of the first example, so that the crystallized semiconductor thin film 516 will be formed (refer to FIG. 7). Therefore, the positions and diameter of the crystal grains can be reliably controlled in the crystallized semiconductor thin film 516, so that the crystal grains have the same size.

As in the method of the first example, the thin film transistors 50, pixel electrodes 51, common pixel electrode 12 of the second transparent substrate 10, and so on are formed. Thereafter, the liquid crystal 15 is applied. The liquid crystal display device 1 of the second example will be completed (refer to FIG. 1).

According to the method of the second example, the metal element at the raised transfer parts 21 of the transcriptional body 20 is selectively pressed to the amorphous semiconductor thin film 515, so that the crystal producing nucleuses 517 are formed on the pressed areas of the amorphous semiconductor thin film 515, which is re-crystallized using the crystal producing nucleuses 517, thereby making the crystalline semiconductor thin film 516. It is possible to reliably control the positions and diameter of the crystal grains on the amorphous semiconductor thin film 515 of the first transparent substrate 2. In this case, no mask making process is necessary for forming the grain producing nucleuses 517. This is effective in reducing the number of crystallizing processes. Further, no crystal producing nucleuses 517 are made at the position where the channel forming region 510 is formed in the amorphous semiconductor thin film 515. Therefore, it is possible to prevent variations of the threshold voltage of the thin film transistor 50 due to the presence of the metal element of the raised transfer parts 21.

In accordance with the method of the second example, the amorphous semiconductor thin film 515 is re-crystallized using its areas for the first and second main electrode regions 511 and 512 of the thin film transistor 50 as the crystal producing nucleuses 517. Even if there are grain boundaries in the channel forming regions 510, a plurality of thin film transistors 50 can have a uniform number of grain boundaries, respectively, which is effective in reducing variations of current-voltage properties. Therefore, the liquid crystal display device 1 can be protected against variations of display performance.

Other Examples

Although the invention has been described with reference to some examples thereof, it will be understood by those skilled in the art that various modifications are possible without depart from the spirit of the invention. The invention is also applicable to an electronic device which includes logic circuits, memories and so on constituted by transistors such as SOI (silicon on insulator) using crystalline semiconductor thin films as operation regions. Further, the invention is applicable to bipolar transistors, resistance elements, capacitance elements and so on.

According to the invention, the raised transfer parts 21 (the crystal producing nucleuses) of the transcriptional body 20 may be circular or square. Alternatively, the crystal producing nucleuses may be rectangular, oval, polygonal or polygonal.

The invention provides the method of manufacturing the semiconductor thin film in which the positions and diameter of the crystal grains can be reliably controlled. The semiconductor thin film can be manufactured by a reduced number of crystallizing processes.

Further, the invention provides the method of manufacturing the electronic device in which the semiconductor element can be reliably crystallized in order to assure electric properties thereof. The electronic device can be manufactured by a reduced number of crystallizing processes.

Still further, the invention provides the method of manufacturing the liquid crystal display device in which the semiconductor element can be reliably crystallized in order to assure electric properties thereof. The liquid crystal display device can be manufactured by a reduced number of crystallizing processes.

What is claimed is:

1. A method of manufacturing a semiconductor thin film, the method comprising:
    forming a semiconductor thin film on a substrate;
    forming a transcriptional body on a part of the substrate, said transcriptional body having applied thereto a solution containing a metal element;
    bringing a transfer part of the transcriptional body into contact with the semiconductor thin film, and transferring the metal element onto the semiconductor thin film; and
    fusing the semiconductor thin film and crystallizing the semiconductor thin film using the metal element of the solution as crystal producing nucleuses.

2. The method of claim 1, wherein the process of forming the transcriptional body is a process of forming the transcriptional body by the metallic material including metallic element of the crystal producing nucleuses.

3. The method of claim 1, wherein the transcriptional body includes raised transfer parts in the shape of a cone or a pyramid.

4. A method of manufacturing a semiconductor thin film, the method comprising:
    forming a semiconductor thin film on a substrate;
    selectively applying a solution onto a part of a transcriptional body, the solution containing a metal element serving as crystal producing nucleuses;
    bringing a part of the transcriptional body into contact with the semiconductor thin film, and transferring the solution onto the semiconductor thin film; and
    fusing the semiconductor thin film and crystallizing the semiconductor thin film using the metal element of the solution as crystal producing nucleuses.

5. The method of claim 4, wherein the solution contains Ni, Co or Fe as the metal element.

6. The method of claim 4, wherein the solution is selectively applied onto raised transfer parts of the transcriptional body, the raised transfer parts being softer than the semiconductor thin film; and the solution selectively applied onto the raised transfer parts of the transcriptional body is transferred onto the semiconductor thin film.

7. The method of claim 5, wherein the solution is selectively applied onto raised transfer parts of the transcriptional body, the raised transfer parts being softer than the semiconductor thin film; and the solution selectively applied onto the raised transfer parts of the transcriptional body is transferred onto the semiconductor thin film.

8. The method of claim 4, wherein the semiconductor thin film is fused by laser beams and is crystallized using the metal element of the solution as crystal producing nucleuses.

9. The method of claim 5, wherein the semiconductor thin film is fused by laser beams and is crystallized using the metal element of the solution as crystal producing nucleuses.

10. The method of claim 6, wherein the semiconductor thin film is fused by laser beams and is crystallized using the metal element of the solution as crystal producing nucleuses.

11. The method of claim 4, wherein the solution is made of a silicone resin.

12. A method of manufacturing an electronic device, the method comprising:
    forming a semiconductor thin film on a substrate;
    selectively applying a solution onto a segmented surface of a transcriptional body, the solution containing a metal element serving as crystal producing nucleuses;
    bringing a part of the transcriptional body into contact with the semiconductor thin film and transferring the solution from the transcriptional body to the semiconductor thin film; and
    fusing the semiconductor thin film, crystallizing the semiconductor thin film using the metal element of the solution as crystal producing nucleuses, and making a semiconductor element.

13. The method of claim 12, wherein the semiconductor element is a transistor which has a main electrode region and a channel forming region on the crystallized area of the semiconductor thin film.

14. The method of claim 13, wherein the solution is selectively applied onto a part of the transcriptional body where the channel forming region of the transistor of the semiconductor thin film is formed.

15. The method of claim 13, wherein the solution is not selectively applied onto a part of the transistor where the channel forming region is made.

16. The method of claim 13, wherein the solution is selectively applied onto a part of the transistor where an isolation region is present between transistors.

17. The method of claim 15, wherein the solution is not selectively applied onto a part of the transistor where the channel forming region is made.

18. A method of manufacturing a liquid crystal display device, the method comprising:
    forming a semiconductor thin film on a first transparent substrate;
    forming a transcriptional body containing a metal element serving as crystal producing nucleuses;
    bringing a part of the transcriptional body into contact with the semiconductor thin film and transferring the metal element of the transcriptional body onto the semiconductor thin film;
    fusing the semiconductor thin film and crystallizing the semiconductor thin film using the metal element as crystal producing nucleuses;
    forming a transistor on the crystallized semiconductor thin film; and
    placing a second transparent substrate on the first transparent substrate, and enclosing a liquid crystal between the first and second transparent substrates.

19. The method of claim 18, wherein the transistor is a thin film transistor.

20. The method of claim 18, wherein the transistor is a thin film transistor in which each vertical scanning line is connected to a gate electrode, and each horizontal scanning line is connected to one electrode region, and a pixel electrode is connected to the other main electrode, thereby forming a pixel.

* * * * *